United States Patent [19]
Lo et al.

[11] Patent Number: 5,115,404
[45] Date of Patent: May 19, 1992

[54] DIGITAL STORAGE OSCILLOSCOPE WITH INDICATION OF ALIASED DISPLAY

[75] Inventors: Pei-hwa Lo, Ramsey, N.J.; Tran Thong, Beaverton, Oreg.

[73] Assignee: Tektronix, Inc., Beaverton, Oreg.

[21] Appl. No.: 138,221

[22] Filed: Dec. 23, 1987

[51] Int. Cl.⁵ ............................................ G06F 15/20
[52] U.S. Cl. ...................................... 395/143; 307/351
[58] Field of Search ........................... 364/521, 715.06; 307/351, 353; 328/151

[56] References Cited
U.S. PATENT DOCUMENTS

| | | | |
|---|---|---|---|
| 4,039,784 | 8/1977 | Quarton et al. | 364/521 |
| 4,143,365 | 3/1979 | Cayzac et al. | 328/151 X |
| 4,271,486 | 6/1981 | Dagostino et al. | 365/45 |
| 4,631,737 | 12/1986 | Davis et al. | 307/351 X |
| 4,639,618 | 1/1987 | Olesen | 307/351 |
| 4,713,771 | 12/1987 | Crop | 328/151 X |

Primary Examiner—H. A. Herndon
Attorney, Agent, or Firm—John Smith-Hill; Peter J. Meza

[57] ABSTRACT

A sequence of n sample values occurring during a recording interval is processed by determining which of the sample values is the smallest and which of them is the largest. The smallest sample value is loaded into one of first and second memory portions in dependence upon whether the smallest value occurred before or after the largest sample value, and the largest sample value is loaded into the other of the first and second memory portions. In this fashion, the order of the smallest and largest sample values is preserved.

3 Claims, 1 Drawing Sheet

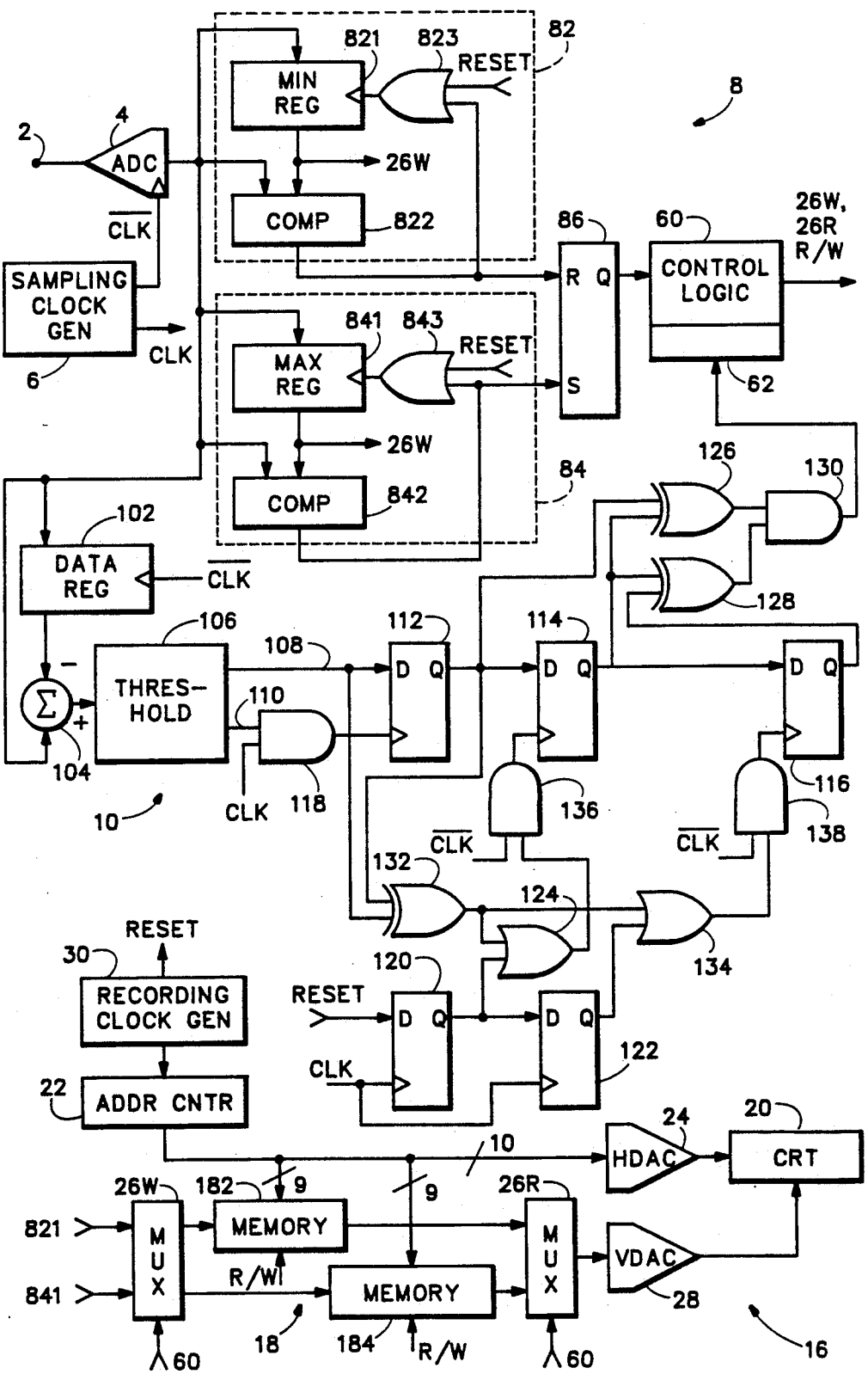

DIGITAL STORAGE OSCILLOSCOPE WITH INDICATION OF ALIASED DISPLAY

This invention relates to a digital storage oscilloscope which provides an indication as to whether the input signal is aliased.

BACKGROUND OF THE INVENTION

A digital storage oscilloscope operates by digitizing an input signal in response to a sampling clock which operates at a constant rate, thereby generating a sequence of sample values, and storing the sample values in a display memory. The display memory is able to store only a limited number of sample values, e.g. 1024. In order to enable the oscilloscope to acquire signals containing high frequency components, the digitizer is designed to be able to sample the input signal at a high sampling rate, e.g. 100 MHz. At a 100 MHz sampling rate, 1024 sample values are generated in about 10 $\mu$s. However, the user of the oscilloscope might need to be able to acquire an input signal over a time period that is much longer than 10 $\mu$s, and if only 1024 sample values can be stored this implies that the effective sampling rate must be reduced, e.g. to 10 MHz. This may be accomplished by using a separate recording clock to control writing of the sample values into the display memory. If the sampling clock rate is 100 MHz and the display clock rate is 10 MHz, the recording clock causes every tenth sample value to be written into the display memory, the other nine sample values being discarded.

If the frequency components of the input signal are all less than half the frequency of the recording clock, the waveform of the input signal can be accurately reconstructed from the stored ensemble of decimated sample values. However, if the input signal has frequency components that are higher than half the frequency of the recording clock, the input signal is aliased when it is written into the display memory and its waveform cannot be reconstructed from the decimated sample values. Even when the input signal is aliased, the envelope of the input signal conveys valid, and useful, information. A method for preserving the envelope of the waveform is to store the maximum and minimum sample values between recording events. However, the conventional digital storage oscilloscope does not provide any means for determining whether the input signal is in fact aliased.

It is known to use the envelope mode of data acquisition to record valid information concerning an input signal that is aliased. As described in U.S. Pat. No. 4,271,486 issued Jun. 2, 1981 (D'Agostino et al), two sample values are stored for each recording clock pulse. These two sample values are the maximum sample value and the minimum sample value occurring within the preceding recording clock period. The contents of the display memory are used to provide a display of the envelope of the input signal.

U.S. Pat. No. 4,039,784 issued Aug. 2, 1977 (Quarton et al) discloses a digital minimum/maximum vector CRT display in which minimum and maximum sample values are identified during a recording clock period. A determination is made as to which of the identified sample values is more relevant, and the more relevant sample value is stored. A determination is also made as to whether the less relevant sample value should be retained and, if so, it is stored during the next recording clock period.

U.S. Pat. No. 4,143,365 issued Mar. 6, 1979 (Cayzac et al) discloses a device for the acquisition and storage of an electrical signal. The waveform epoch of the signal is divided into elementary time intervals, and during each interval the maximum and minimum amplitude values of the signal are determined. These maximum and minimum amplitude values are stored.

SUMMARY OF THE INVENTION

A preferred embodiment of the present invention in a first aspect is a method of processing a sequence of n sample values occurring during a recording interval, comprising determining which of the sample values is the smallest and which of them is the largest. The smallest sample value is loaded into one of first and second memory portions in dependence upon whether the smallest value occurred before or after the largest sample value, and the largest sample value is loaded into the other of the first and second memory portions.

Preferably, the method described in the previous paragraph is repeated m times, whereby 2m sample values are stored, and the stored sample values are subsequently read and used to create a display. In each recording interval, a determination is made as to whether the sign of the rate of change of sample value with respect to time changed more than twice during the recording interval and, if so, the sample values that are read for that recording interval are used to create a display of two traces, representing the values stored in the two memory portions respectively for that interval; otherwise, the values stored in the two memory portions are used to create a display of a single trace.

BRIEF DESCRIPTION OF THE DRAWINGS

For a better understanding of the invention, and to show how the same may be carried into effect, reference will now be made, by way of example, to the accompanying drawing, the single FIGURE of which is a block diagram of a digital storage oscilloscope.

DETAILED DESCRIPTION

The illustrated digital storage oscilloscope, which comprises an acquisition section 8 and a display section 16, is operable in a single shot acquisition mode. When in the single shot acquisition mode, the oscilloscope functions first in an acquisition state and then in a display state. The acquisition section 8 has an input terminal 2 at which the oscilloscope receives an analog signal from a circuit under test. The input terminal is connected to an analog-to-digital converter (ADC) 4, which digitizes the input signal under control of a sampling clock generated by a sampling clock generator 6. Therefore, the ADC provides at its output a digital signal comprising a sequence of digital data words occurring at the frequency of the sampling clock. The sampling clock rate may be, for example, 100 MHz, in which case successive data words are generated at intervals of 0.01 $\mu$s. The input signal is sampled on the falling edge of the sampling clock pulse. Other operations are performed in response to the rising edge of the sampling clock pulse, and by sampling on the falling edge it is ensured that the output of the ADC 4 has settled when the other operations are performed. Of course, the input signal may be sampled on the rising edge of the sampling clock pulse if the other operations are performed in response to the falling edge.

The display section 16 comprises a display memory 18 and a cathode-ray tube (CRT) 20. The display memory 18 is in two portions 182 and 184, each of which has 512 separately addressable memory locations. Read and write access to the two portions of the memory is under control of multiplexers 26W and 26R and read and write enable signals provided by control logic 60. An address counter 22 operates under control of a recording clock generator 30 to provide a sequence of 10 bit digital address words. In the acquisition state, the upper 9 bits of the address words are used to address both portions of the display memory 18. In the display state, the address words provided by the counter 22 are used not only to address the display memory but also to control the horizontal deflection of the electron beam of the CRT, by causing a digital-to-analog converter (DAC) 24 to generate a voltage signal which is applied to the horizontal deflection circuitry (not shown) of the CRT 20. The dynamic range of the horizontal DAC 24 is such that an address word having a value corresponding to decimal 0 results in the electron beam being directed to the left edge of the screen of the CRT and an address word having a value corresponding to decimal 1023 results in the beam being directed to the right edge of the CRT screen.

The recording clock rate is adjustable. If it was desired to observe the waveform of the input signal over an interval of about 100 s, a recording clock rate of 10 MHz could be used. If the sampling clock rate was 100 MHz, the recording clock period would then correspond to ten sampling clock periods. The input signal would be aliased if it included frequency components higher than 5 MHz. At the end of each recording clock period, the recording clock generator 30 generates a reset pulse.

The acquisition section 8 has a minimum channel 82 and a maximum channel 84. The minimum channel and the maximum channel comprise respective registers 821 and 841 which receive load enable signals from OR gates 823, 843. The reset pulse is applied to the OR gates 823, 843, and therefore the first data word provided by the ADC 4 after the reset pulse is loaded into the register 821, 841. As each new data word is received from the ADC, it is compared, in comparators 822 and 842, with the contents of the registers 821 and 841 respectively. If the value of the new data word is less than the value stored in the register 821, the minimum comparator 822 provides a logical 1 at its output; otherwise, the minimum comparator 822 provides a logical 0. Similarly, the maximum comparator 842 provides a logical 1 if the new data word is greater than the value stored in the register 841 and otherwise provides a logical 0. The outputs of the comparators 822, 842 constitute the second inputs of the gates 823, 843 respectively, and therefore a logical 1 provided by the comparator 822 or 842 is applied as a load enable signal to the register 821 or 841, with the result that the new data word is written into the register 821 or 841, as the case may be.

A logical 1 provided by the comparator 822 or 842 is also applied to an RS flip-flop 86. The state of the Q output of the flip-flop 86 is sampled on the falling edge of the last sampling clock pulse during a recording clock period and the result is applied to the control logic 60. If, at the end of a recording clock period, the Q output is logical 0, it implies that the register 821 has been updated more recently than has the register 841, and similarly if the Q output is logical 1 the register 841 has been updated more recently than has the register 821. Thus, the state of the Q output of the flip-flop 86 represents the order in which the registers 821 and 841 have been updated.

The output of the ADC 4 is applied to an aliasing detector 10. The aliasing detector 10 comprises a register 102 which receives the data words provided by the ADC 4 and is updated on the falling edge of the sampling clock. Accordingly, the output of the register 102 is the same as its input but is delayed by one sampling clock period. The output of the register 102 is applied to one input of a subtractor 104, which receives the current data word at its other input. The output of the subtractor 104 thus represents the slope of the waveform applied to the terminal 2.

The output of the subtractor 104 is applied to a threshold circuit 106. The threshold circuit has two output terminals 108 and 110. The terminal 108 is at logical 1 if the input signal received by the threshold circuit 106 is positive, i.e., represents a positive slope value, and is at logical 0 if the input signal is negative (a negative slope value). The terminal 110 is at logical 1 if the absolute value of the output signal of the subtractor 104 is greater than a desired threshold value, and is at logical 0 if the output signal of the subtractor 104 is less than or equal to the threshold value. The terminal 108 is connected to the D input terminal of a first of three D-type flip-flops 112, 114 and 116, the Q output terminals of the flip-flops 112 and 114 being connected to the D input terminals of the flip-flops 114 and 116 respectively. The terminal 110 of the threshold circuit is connected to an AND gate 118, which receives the sampling clock signal at its other input and has its output connected to the clock input terminal of the flip-flop 112. Accordingly, the flip-flop 112 does not receive the clock pulses applied to the AND gate 118 unless the output terminal 110 of the threshold circuit 106 is at logical 1. This ensures that minor perturbations in the value of the output signal provided by the ADC, e.g. due to noise, are ignored for the purpose of determining whether the analog input signal is aliased. Assuming that the terminal 110 is at logical 1, the logical state present at the terminal 108 is clocked to the Q output of the flip-flop 112 on the rising edge of the next sampling clock pulse.

The terminal 108 and the Q output terminal of the flip-flop 112 are connected to respective inputs of an exclusive OR gate 132, whose output is connected through OR gates 124 and 134 and AND gates 136 and 138 to the clock inputs of the flip-flops 114 and 116 respectively. The AND gates 136 and 138, which receive the clock signal from the sampling clock generator 6, are provided for synchronization purposes. Thus, the flip-flops 114 and 116 are clocked on the rising edge of the clock pulse when the Q output of the flip-flop 112 is at a different logical state from its D input.

The Q outputs of the flip-flops 112 and 114 are connected to respective inputs of an exclusive OR gate 126, and the Q outputs of the flip-flops 114 and 116 are connected to respective inputs of an exclusive OR gate 128. The outputs of the gates 126 and 128 are connected to an AND gate 130. The AND gate 130 provides a logical 1 output only if the Q output of the flip-flop 114 is in a different logical state from the Q outputs of the flip-flops 112 and 116.

The aliasing detector 10 includes an initialization circuit which comprises two D-type flip-flops 120 and 122. At the end of a recording clock period, the D input terminal of the flip-flop 120 receives the reset pulse, and therefore its Q output terminal goes high on the next sampling clock pulse. The Q output terminal of the flip-flop 120 is connected to the D input terminal of the flip-flop 122 and to the OR gate 124. Accordingly, on the second sampling clock pulse after the reset pulse (at which time the Q output of the flip-flop 112 represents the direction of the slope of the waveform at the beginning of the new recording clock period), the flip-flop 114 is clocked and therefore the logical state of the Q output of the flip-flop 114 represents the initial slope direction. Similarly, on the third sampling clock pulse after the reset pulse, the Q output terminal of the flip-flop 122 goes high and the flip-flop 116 is clocked, so that the logical state of the Q output of the flip-flop 116 represents the initial slope direction.

If the initial slope value provided by the subtractor was positive, the Q outputs of the flip-flops 112, 114 and 116 are initialized to logical 1. If thereafter the subtractor provided a negative slope value, the output terminal 108 of the threshold circuit 106 would be placed at logical 0. The two inputs of the exclusive OR gate 132 would then be different and therefore the output of the gate 132 would be a logical 1 and the flip-flops 114 and 116 would be clocked. However, since the Q output of the flip-flop 112 is at logical 1, the Q output of the flip-flop 114 would remain at logical 1. On the next sampling clock pulse, the Q output terminal of the flip-flop 112 would be placed at logical 0. If the subtractor 104 thereafter provided a positive slope value, the output terminal 108 of the threshold circuit 106 would be placed at logical 1, and consequently the output of the gate 132 would clock the flip-flops 114 and 116, and the logical 0 at the Q output of the flip-flop 112 would be clocked to the Q output of the flip-flop 114. On the next sampling clock pulse, the Q output of the flip-flop 112 would become logical 1. Both inputs received by the gate 130 would then be logical 1, and the gate 130 would provide a logical 1 output. The output of the gate 130 will remains at logical 1 until the aliasing detector is initialized at the start of the next recording clock period.

In similar fashion, it can be shown that the gate 130 provides a logical 1 output if, during a recording interval, the slope is initially negative, becomes positive and becomes negative once more. Accordingly, the AND gate 130 provides a logical 1 output signal if there are at least two changes in the slope of the waveform of the analog input signal during the recording clock period.

The output of the AND gate 130 is the output of the aliasing detector 10. The state of the output of the AND gate 130 is sampled on one edge (rising or falling) of the last sampling clock pulse before the reset pulse, and the result is applied to the control logic 60. The control logic 60 includes a storage element 62 having 1024 one-bit storage locations, corresponding to successive recording clock periods. If the output of the AND gate 130 is at logical 1 at the end of a recording clock period, the corresponding bit of the storage element 62 is set.

At the end of each recording clock period, the contents of the minimum and maximum registers 821 and 841 are transferred to the display memory 18 by applying appropriate control signals to the acquisition section 8 and the display memory 18. The control logic 60 sets the multiplexer 26W to write the contents of the registers 821 and 841 into the memory portions 182 and 184 in accordance with the output signal provided by the flip-flop 86: if the output of the flip-flop 86 is logical 0, the contents of the minimum register 821 are loaded into the memory portion 184 and the contents of the maximum register 841 are loaded into the memory portion 182; and if the output of the flip-flop 86 is logical 1, the contents of the register 821 are loaded into the memory portion 182 and the contents of the register 841 are loaded into the memory portion 184.

In the display state, the address words provided by the counter 22 are applied both to the display memory 18 and to the horizontal DAC 24. Data words that are successively read from the memory are applied to the CRT 20 by way of a vertical DAC 28. Each memory location of the display memory is able to store a digital word having 10 bits, and the dynamic range of the vertical DAC 28 is selected so that a data word having a value corresponding to decimal 0 causes the electron beam to be directed to the bottom edge of the CRT whereas a data word having a value corresponding to decimal 1023 causes the beam to be directed to the top edge of the screen.

Data words are read from the memory by the upper 9 bits of the address signal. If the input signal is not aliased, the multiplexer 26R, controlled by the control logic 60, selects the two memory portions in alternating fashion on successive address words, and therefore the electron beam of the CRT writes a single trace on the screen of the CRT. Because the output signal provided by the flip-flop 86 reflects the order in which the registers 821 and 841 are updated, the trace accurately represents the order in which the data words represented by the displayed points occurred. If the contents of the storage element 62 indicate that the input signal was aliased during one or more recording clock periods, the contents of the corresponding locations of the memory portions 182 and 184 are read on alternate sweeps, with the multiplexer 26R selecting the memory portion 182 on one sweep and the memory portion 184 on the next sweep. In this manner, a maximum trace and a minimum trace are written on the screen of the CRT for recording clock periods during which aliasing is detected and therefore the envelope of the aliased signal is displayed. The envelope is independent of the order in which the maximum and minimum sample values occurred in the recording clock period, and therefore it is not necessary to control the writing of sample values into the memory in dependence on whether aliasing is detected. The brightness of the trace of the envelope of the aliased signal is half that of the trace representing an unaliased signal.

It will be appreciated that the present invention is not restricted to the particular embodiment that has been described and illustrated, and that variations may be made therein without departing from the scope of the invention as defined in the appended claims and equivalents thereof. In particular, the invention is not limited to the particular display method that has been described. For example, the stored sample values may be used to provide a more complex display, such as an interpolated waveform having more than 1024 points.

We claim:

1. A method of processing a sequence of n sample values occurring during a recording interval, comprising:
   (a) determining which of the n sample values is the smallest,
   (b) determining which of the n sample values is the largest,
   (c) determining whether the smallest sample value occurred before or after the largest sample value and loading the smallest sample value into one of first and second memory portions in dependence upon whether the smallest sample value occurred before or after the largest sample value and loading the largest sample value into the other of the first and second memory portions, (d) determining whether the rate of change of sample value with respect to time changed in sign more than twice during the recording interval, (e) repeating steps (a)-(d) m times, where m is an integer greater than three, whereby 2m sample values are stored, (f) reading the stored sample values, and (g) in the event that the sign of the rate of change of sample value with respect to time is determined to have changed more than twice during a recording interval, utilizing the read sample values for that recording interval as coordinates that are plotted on a display device to create a display thereon of a first trace representing the value stored in the first memory portion for that recording interval and a second trace representing the value stored in the second memory portion for that recording interval.

2. A method of processing a sequence of n sample values occurring during a recording interval, comprising:

(a) determining which of the n sample values is the smallest, (b) determining which of the n sample values is the largest, (c) determining whether the smallest sample value occurred before or after the largest sample value and loading the smallest sample value into one of first and second memory portions in dependence upon whether the smallest sample value occurred before or after the largest sample value and loading the largest sample value into the other of the first and second memory portions, (d) determining whether the rate of change of sample value with respect to time changed in sign more than twice during the recording interval, (e) repeating steps (a)-(d) m times, where m is an integer greater than three, whereby 2m sample values are stored, (f) reading the stored sample values, and (g) in the event that the sign of the rate of change of sample value with respect to time is determined not to have changed more than twice during a recording interval, utilizing the read sample values for that recording interval as coordinates that are plotted on a display device to create a display thereon of a single trace representing the sequence in which the read sample values occurred.

3. Apparatus for processing a sequence of n sample values occurring during a recording interval, comprising:

(a) minimum comparator means for determining which of the n sample values is the smallest, (b) maximum comparator means for determining which of the n sample values is the largest, (c) first and second memory portions, (d) address control means for loading the smallest sample value into one of said first and second memory portions in dependence upon whether the smallest value occurred before or after the largest sample value and loading the largest sample value into the other of the first and second memory portions, wherein each of the first and second memory portions has m storage locations, whereby 2m sample values can be stored, (e) means for reading the stored values and utilizing the read values as coordinates that are plotted on a display device to create a display thereon, (f) means for determining whether the sign of the rate of change of sample value with respect to time changes more than twice during a recording interval, and (g) control means for controlling reading of the stored values from the first and second memory portions in dependence upon whether or not the sign of the rate of change of sample value with respect to time is determined to have changed more than twice during a recording interval.

* * * * *